(12) United States Patent
Melichar (10) Patent No.: US 7,375,497 B2
(45) Date of Patent: May 20, 2008

(54) STATE OF CHARGE TRACKING SYSTEM FOR BATTERY SYSTEMS

(75) Inventor: Robert Melichar, Troy, MI (US)

(73) Assignee: Cobasys, LLC, Orion, MI (US)

( * ) Notice: Subject to any disclaimer, the term of this patent is extended or adjusted under 35 U.S.C. 154(b) by 379 days.

(21) Appl. No.: 11/081,978

(22) Filed: Mar. 16, 2005

(65) Prior Publication Data

US 2005/0231164 A1    Oct. 20, 2005

Related U.S. Application Data

(60) Provisional application No. 60/559,921, filed on Apr. 6, 2004.

(51) Int. Cl.
*H02J 7/00* (2006.01)

(52) U.S. Cl. .............. 320/132; 320/127; 320/128; 320/137; 320/162; 324/426; 324/427; 324/428; 324/432

(58) Field of Classification Search ............... 320/127, 320/128, 132, 137, 162; 324/426, 427, 428, 324/432
See application file for complete search history.

(56) References Cited

U.S. PATENT DOCUMENTS

| | | | |
|---|---|---|---|
| 4,394,741 A | 7/1983 | Lowndes | |
| 4,558,281 A | 12/1985 | Codd et al. | |
| 4,876,513 A | 10/1989 | Brilmyer et al. | |
| 5,119,011 A | 6/1992 | Lambert | |
| 5,295,078 A | 3/1994 | Stich et al. | |
| 5,321,627 A | 6/1994 | Reher | |
| 5,412,323 A | 5/1995 | Kato et al. | |
| 6,160,380 A | 12/2000 | Tsuji et al. | |
| 6,356,083 B1 | 3/2002 | Ying | |
| 6,359,419 B1 | 3/2002 | Verbrugge et al. | |
| 6,388,447 B1 | 5/2002 | Hall et al. | |
| 6,417,668 B1 | 7/2002 | Howard et al. | |
| 6,441,586 B1 | 8/2002 | Tate, Jr. et al. | |

(Continued)

FOREIGN PATENT DOCUMENTS

DE    101 47 565 A1    4/2003

(Continued)

OTHER PUBLICATIONS

International Search Report dated Sep. 12, 2005 for Application No. PCT/US2005/011761; 6 pages.

*Primary Examiner*—Akm Ullah
*Assistant Examiner*—Johali A Torres Ruiz
(74) *Attorney, Agent, or Firm*—Harness, Dickey & Pierce, P.L.C.

(57) ABSTRACT

A battery control module for a battery system comprises a voltage measuring module that measures battery and a current measuring module that measures battery current. A state of charge (SOC) module communicates with the current and voltage measuring modules and estimates SOC at least one of when an accumulated charge swing during charge is greater than or equal to an accumulated discharge swing during a prior discharge and a negative of a charge current is within a predetermined window of a negative of a retained discharge current during the prior discharge and/or when an accumulated discharge swing during discharge is greater than or equal to an accumulated charge swing during a prior charge and a negative of a discharge current is within a predetermined window of a negative of a retained charge current during the prior charge.

32 Claims, 6 Drawing Sheets

U.S. PATENT DOCUMENTS

| | | |
|---|---|---|
| 6,639,385 B2 | 10/2003 | Verbrugge et al. |
| 6,653,817 B2 | 11/2003 | Tate, Jr. et al. |
| 6,661,231 B1 * | 12/2003 | Arai et al. ................. 324/426 |
| 6,946,818 B2 * | 9/2005 | Cawthorne et al. ......... 320/134 |
| 2002/0113594 A1 | 8/2002 | Satake |
| 2003/0112011 A1 | 6/2003 | Guitheen et al. |
| 2003/0169049 A1 | 9/2003 | Kawaguchi et al. |
| 2003/0195719 A1 * | 10/2003 | Emori et al. ................ 702/183 |

FOREIGN PATENT DOCUMENTS

| | | |
|---|---|---|
| DE | 10147562 | 4/2003 |
| EP | 0 560 468 A | 9/1993 |
| EP | 1 085 592 A | 3/2001 |
| EP | 1 139 464 A2 | 10/2001 |
| EP | 1 220 413 A | 7/2002 |
| GB | 2086060 A | 5/1982 |

* cited by examiner

STATE OF CHARGE TRACKING SYSTEM FOR BATTERY SYSTEMS

CROSS-REFERENCE TO RELATED APPLICATIONS

This application claims the benefit of U.S. Provisional Application No. 60/559,921, filed on Apr. 6, 2004. This application is related to U.S. patent application Ser. No. 11/081,980 filed on Mar. 16, 2005 and Ser. No. 11/081,979 filed on Mar. 16, 2005. The disclosures of the above applications are incorporated herein by reference in their entirety.

FIELD OF THE INVENTION

The present invention relates to battery systems, and more particularly to state of charge tracking systems for battery systems.

BACKGROUND OF THE INVENTION

Battery systems may be used to provide power in a wide variety applications. Exemplary transportation applications include hybrid electric vehicles (HEV), electric vehicles (EV), Heavy Duty Vehicles (HDV) and Vehicles with 42-volt electrical systems. Exemplary stationary applications include backup power for telecommunications systems, uninterruptible power supplies (UPS), and distributed power generation applications.

Examples of the types of batteries that are used include nickel metal hydride (NiMH) batteries, lead-acid batteries and other types of batteries. A battery system may include a plurality of battery subpacks that are connected in series and/or in parallel. The battery subpacks may include a plurality of batteries that are connected in parallel and/or in series.

The maximum and/or minimum power that can be delivered by batteries, battery subpacks and/or battery systems varies over time as a function of a temperature of the batteries, battery state of charge (SOC) and/or battery age. Therefore, accurate estimation of battery SOC is important to the determination of maximum and minimum power.

The energy that can be provided by or sourced to a battery is a function of state of charge. When the battery state of charge is known and targeted during operation, an optimal ratio can maintained between the ability to accept amp-hours in charge and to provide amp-hours in discharge. As this optimal ratio can be maintained, there is a reduced need to oversize the battery system to assure adequate power assist and regeneration energy.

For example in transportation applications such as HEVs or EVs, it is important for the powertrain control system to know the maximum and/or minimum power limit of the battery system. The powertrain control system typically receives an input request for power from an accelerator pedal. The powertrain control system interprets the request for power relative to the maximum power limit of the battery system (when the battery system is powering the wheels). The minimum power limits may be relevant during recharging and/or regenerative braking. Exceeding the maximum and/or minimum power limits may damage the batteries and/or the battery system and/or reduce the operational life of the batteries and/or the battery system. Being able to estimate the battery SOC accurately has been somewhat problematic—particularly when the battery system includes NiMH batteries.

SUMMARY OF THE INVENTION

A battery control module for a battery system comprises a voltage measuring module that measures battery voltage and a current measuring module that measures battery current. A state of charge (SOC) module communicates with the current and voltage measuring modules and estimates SOC when an accumulated charge swing during charge is greater than or equal to an accumulated discharge swing during a prior discharge and a negative of a charge current is within a predetermined window of a negative of a retained discharge current during the prior discharge.

In other features, the SOC module estimates SOC when an accumulated discharge swing during discharge is greater than or equal to an accumulated charge swing during a prior charge and a negative of a discharge current is within a predetermined window of a negative of a retained charge current during the prior charge.

A battery control module for a battery system comprises a voltage measuring module that measures battery voltage and a current measuring module that measures battery current. A state of charge (SOC) module communicates with the current and voltage measuring modules and estimates SOC when an accumulated discharge swing during discharge is greater than or equal to an accumulated charge swing during a prior charge and a negative of a discharge current is within a predetermined window of a negative of a retained charge current during the prior charge.

In other features, the SOC module estimates SOC when an accumulated charge swing during charge is greater than or equal to an accumulated discharge swing during a prior discharge and a negative of a charge current is within a predetermined window of a negative of a retained discharge current during the prior discharge.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses. For purposes of clarity, the same reference numbers will be used in the drawings to identify the same elements. As used herein, the term module or device refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the term current swing refers to current integrated over a duration during which the charge (polarity) is in one direction. Charge swing may be expressed in units of Amp-seconds or A-s.

Figure 1:
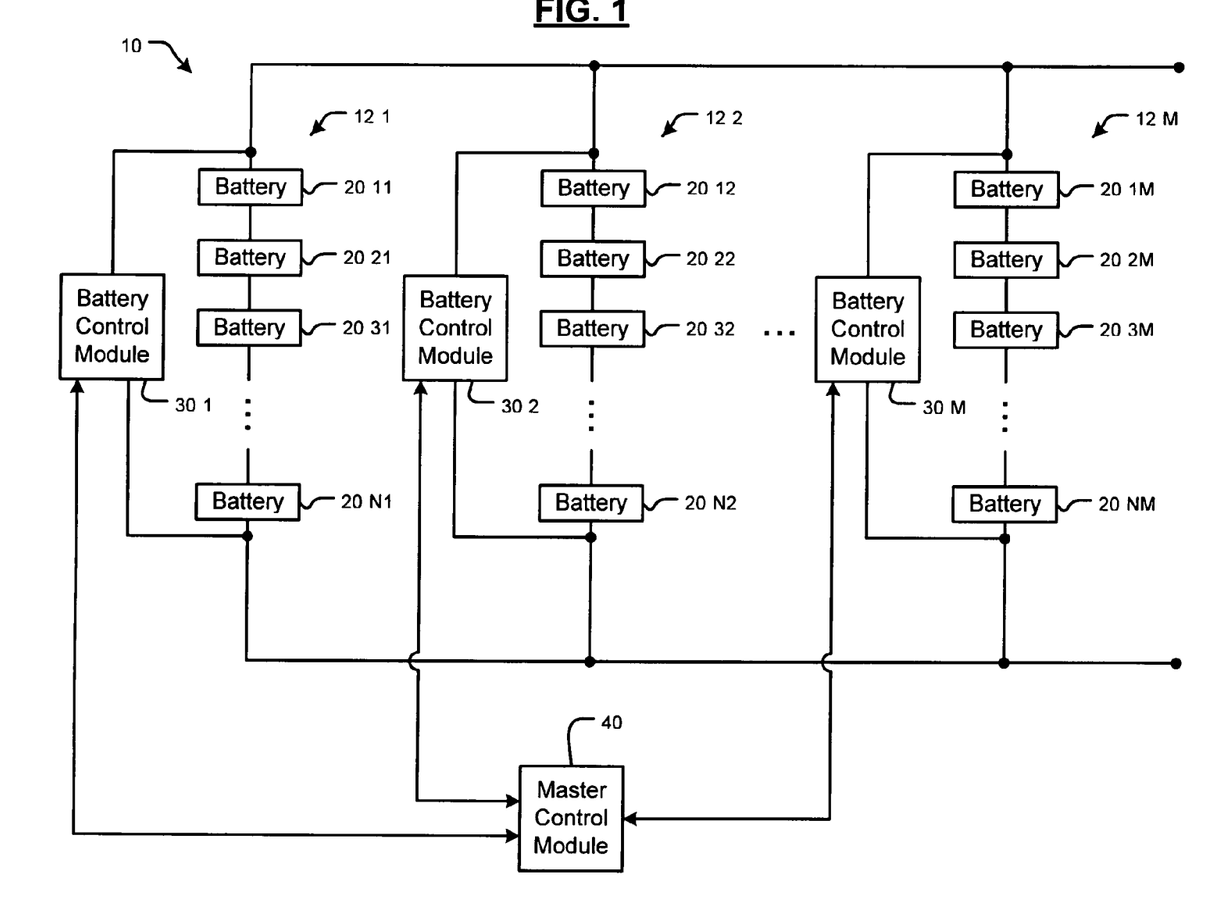
FIG. 1 is a functional block diagram of a battery system including battery subpacks, battery control modules and a master control module.

An exemplary system that can be used to calculate the SOC will be shown, although skilled artisans will appreciate that other systems may be used. Referring now to FIG. 1, an exemplary embodiment of a battery system 10 is shown to include M battery subpacks 12-1, 12-2, ..., and 12-M (collectively battery subpacks 12). The battery subpacks 12-1, 12-2, ..., and 12-M include N series connected batteries 20-11, 20-12, ..., and 20-NM (collectively batteries 20). Battery control modules 30-1, 30-2, ... and 30-M (collectively battery control modules 30) are associated with each of the battery subpacks 12-1, 12-2, ... and 12-M, respectively. In some embodiments, M is equal to 2 or 3, although additional or fewer subpacks may be used. In some embodiments, N is equal to 12-24, although additional and/or fewer batteries may be used.

The battery control modules 30 sense voltage across and current provided by the battery subpacks 12. Alternatively, the battery control modules 30 may monitor one or more individual batteries 20 in the battery subpacks 12 and appropriate scaling and/or adjustment is performed. The battery control modules 30 communicate with a master control module 40 using wireless and/or wired connections. The master control module 40 receives the power limits from the battery control modules 30 and generates a collective power limit. The SOC can be calculated for each module, in groups and/or collectively. The battery control module 30 may be integrated with the master control module 40 in some embodiments.

Figure 2:
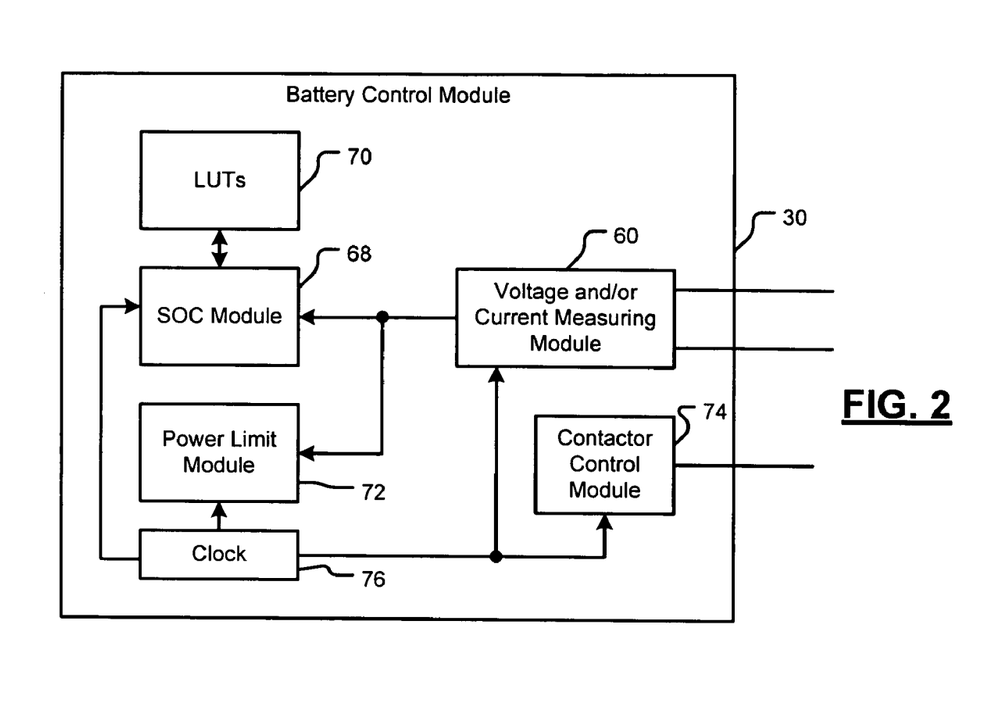
FIG. 2 is a more detailed functional block diagram of a battery control module.

Referring now to FIG. 2, some of the elements of the battery control modules 30 are shown. The battery control modules 30 include a voltage and/or current measuring module 60 that measures voltage across the battery subpack 12 and/or across one or more individual batteries 20 in the battery subpack 12. The battery control modules 30 further include a battery state of charge (SOC) module 68 that periodically calculates the SOC of the batteries 20 in the battery subpacks 12. In one implementation, the SOC module 68 uses a power ratio estimation and/or $V_O$ approach, as will be described below. In another implementation, the SOC module 68 uses a relaxation voltage SOC estimation approach, as will be described below. The SOC module 68 may employ a lookup table 70, formulas and/or other methods.

A power limit module 72 calculates a maximum current limit $I_{lim}$, voltage limit $V_{lim}$, and/or power limit $P_{lim}$ for the battery subpack 12 and/or one or more batteries 20 in the battery subpack 12, as will be described further below. The limits may be maximum and/or minimum limits. A contactor control module 74 controls one or more contactors (not shown) that are associated with the control and/or connection of the batteries 20 in the battery subpacks 12. A clock circuit 76 generates one or more clock signals for one or more modules within the battery control module 30.

Figure 3:
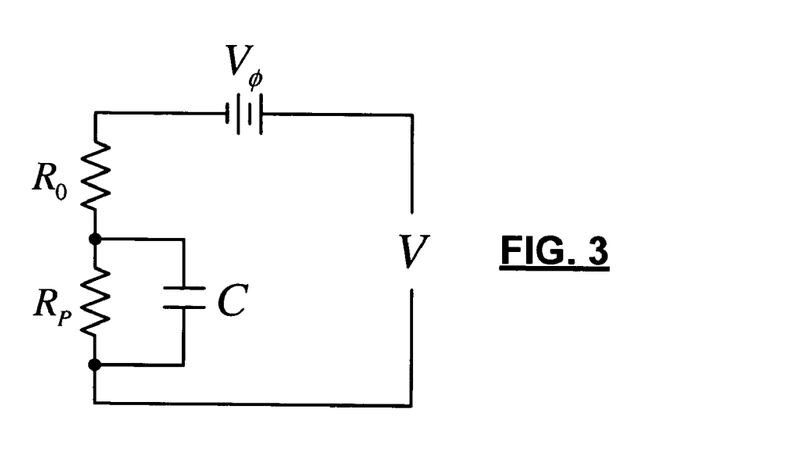
FIG. 3 is an equivalent circuit of a battery.

Referring now to FIG. 3, an equivalent circuit for the battery 20 is shown where $R_O$ represents ohmic resistance of the battery, $V_P$ represents the polarization voltage, $V_O$ represents the open circuit or relaxation voltage, I represents battery current and V represents battery voltage. V and I are measured values. $R_p$ varies with temperature, duration of applied current and SOC. $V_O$ and $R_O$ vary primarily with SOC. $V_P$ is equal to measured current I times $R_p$. Using the equivalent circuit and Kirchoff's voltage rules for the battery 20, $V=V_O+V_P+IR_O$.

Relaxation voltage is relatively insensitive to temperature and current demand and is a good indicator of SOC. A set of specialized current pulses can be used to condition the battery to yield SOC dependent relaxation voltages. This approach is referred to herein as relaxation voltage SOC estimation.

Figure 4:
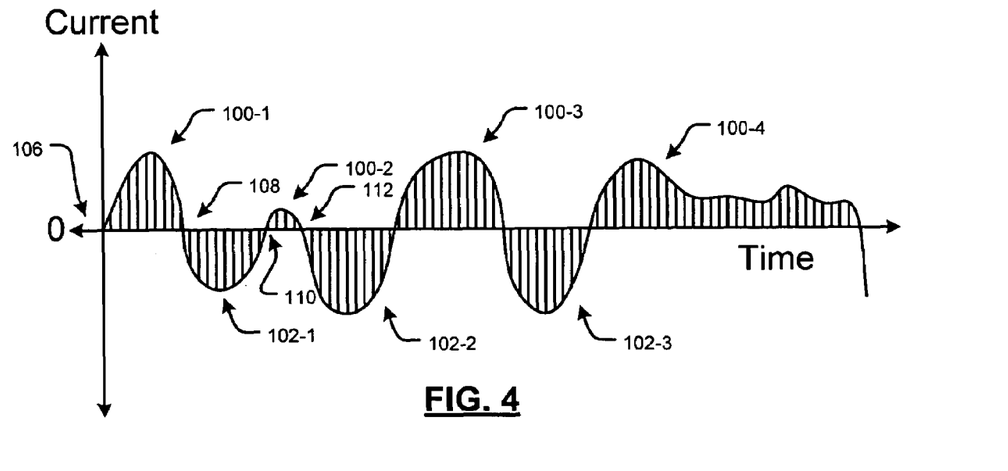
FIG. 4 is a graph of battery current as a function of time.

Referring now to FIG. 4, battery current is shown as a function of time. Current that is greater than zero, for example at 100-1, 100-2, 100-3, and 100-4, is charging current. Current that is less than zero, for example at 102-1, 102-2, and 102-3, is discharging current. The areas under the curve between points 106 and 108 and points 110 and 112 are defined as a charge swing in A-s. The area under the current curve between points 108 and 110 is defined as a discharge swing in A-s.

Figure 5A:
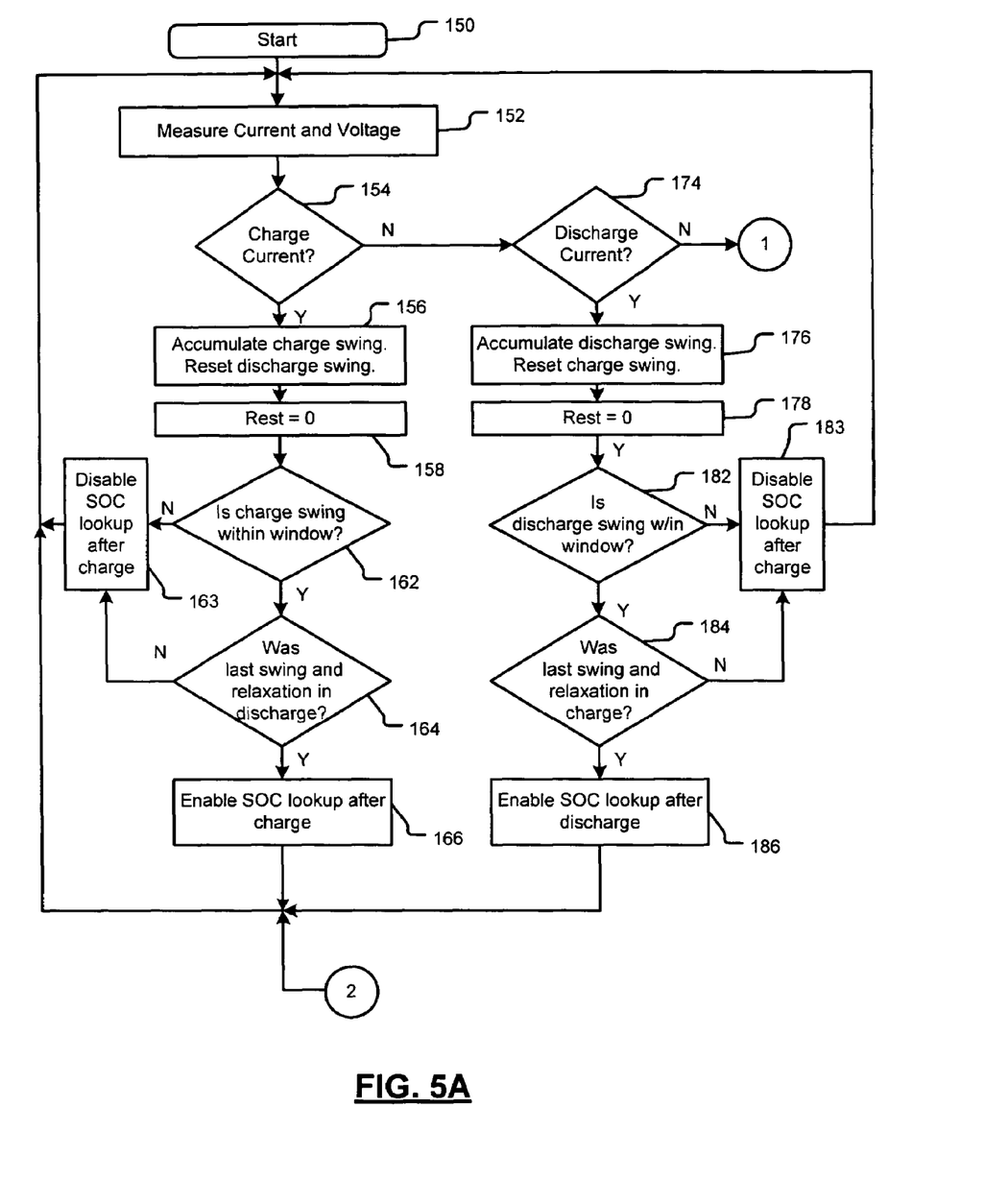
FIGS. 5A and 5B are flowcharts illustrating steps of a relaxation voltage approach for estimating state of charge.
Figure 5B:
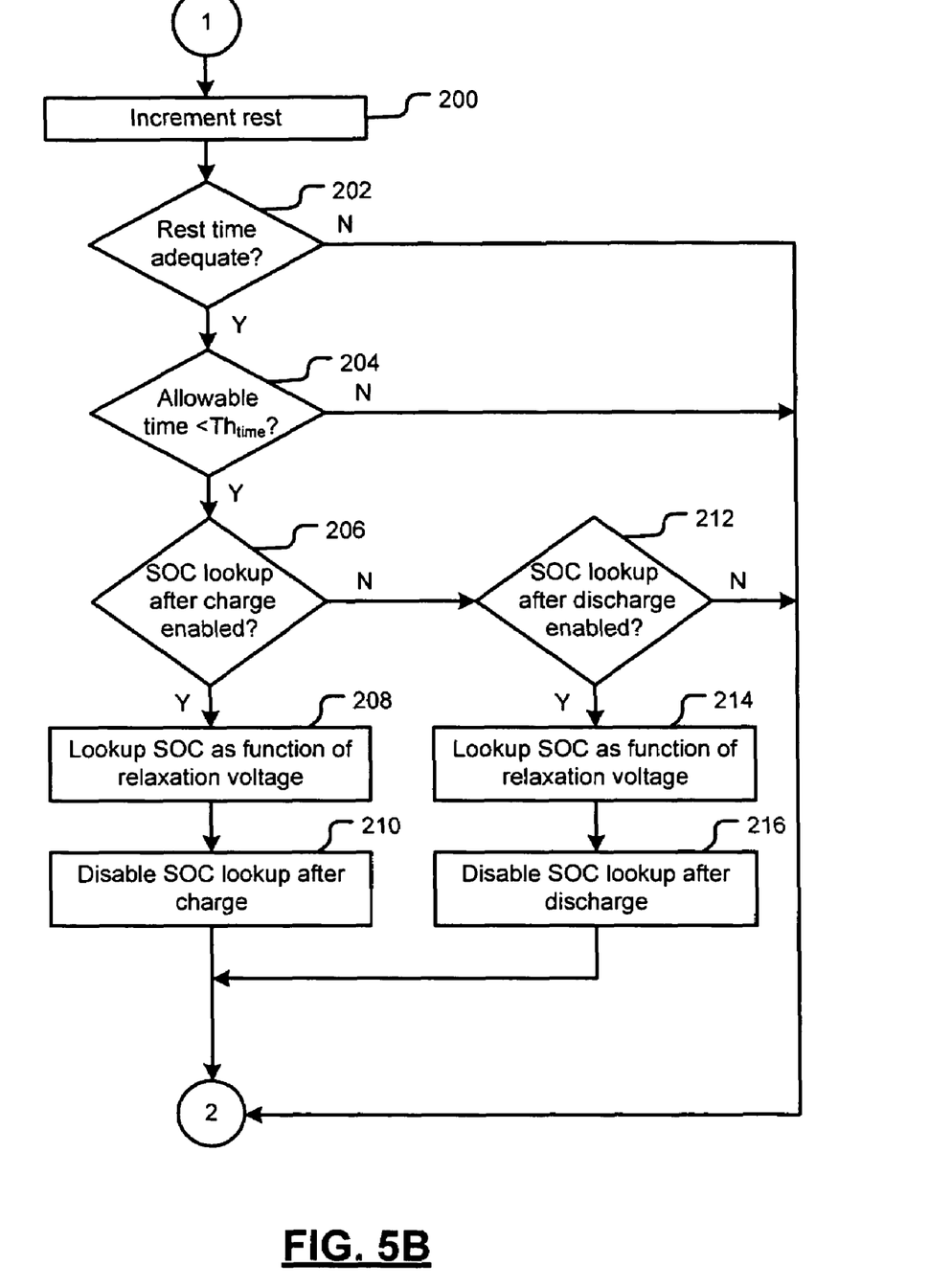

Referring now to FIGS. 5A and 5B, steps of a method for implementing a relaxation voltage SOC estimation approach are shown. The relaxation voltage estimation approach monitors battery current for a pair of power pulses, checks relaxation voltage after each and determines SOC using the lookup table 70. The relaxation voltage approach was derived based on the observation of voltage responses to pulses throughout a range operating of temperatures, such as −15° C. to 45° C. The relaxation voltages were affected by swing amplitudes, pulse amplitudes and whether the battery was brought from top of charge or bottom of charge.

In FIGS. 5A and 5B, control begins with step 150. In step 152, the current and voltage are measured. In step 154, control determines whether the measured current is charge current (current>zero or a predetermined threshold). If step 154 is true, control accumulates charge swing and resets discharge swing in step 156. In step 158, control sets a rest variable equal to zero. In step 162, control determines whether the accumulated charge swing is within a predetermined window. The window may include upper and lower thresholds. In some implementations, the upper and lower thresholds are between 10% and 100% of battery capacity, although other values may be used. If not, control disables SOC lookup after charge in step 163 and returns to step 152.

If step 162 is true, control continues with step 164 and determines whether last swing and relaxation occurred in discharge. As used herein, relaxation refers to battery voltage asymptotically approaching the relaxation voltage. If not, control continues with step 163. If step 164 is true, control enables SOC lookup after charge in step 166.

If step 154 is false, control continues with step 174. In step 174, control determines whether the measured current is discharge current (current<zero or a predetermined threshold). If step 174 is true, control accumulates discharge swing and resets charge swing in step 176. In step 178, control sets the rest variable equal to zero. In step 182, control determines whether the accumulated discharge swing is within a predetermined window. The window may include upper and lower thresholds that may be similar to the accumulated charge swing thresholds or different therefrom. If not, control disables SOC lookup after discharge in step 183 and returns to step 152.

If step 182 is true, control continues with step 184 and determines whether last swing and relaxation occurred in charge. If not, control continues with step 183. If step 184 is true, control enables SOC lookup after discharge in step 186.

If step 174 is false, control continues in FIG. 5B with step 200 and increments the rest variable. In step 202, control determines whether rest time is adequate by comparing rest time to a threshold. In some implementations, approximately 120 seconds is used as a threshold, although other values may be used. If step 202 is true, control determines whether allowable time is less than a threshold time Th$_{time}$ in step 204. In some implementations, allowable time is equal to 240 seconds, although other values may be used. Exceeding this value tends to indicate that the pulses were not controlled enough for an SOC estimation.

If step 204 is true, control continues with step 206 and determines whether SOC lookup after charge is enabled. If step 206 is true, control looks up SOC as a function of relaxation voltage in step 208 and disables SOC lookup after charge in step 210 and control returns to step 152. If step 206 is false, control continues with step 212 and determines whether SOC lookup after discharge is enabled. If step 212 is true, control looks up SOC as a function of relaxation voltage in step 214 and disables SOC lookup after discharge in step 216 and control returns to step 152. If steps 202, 204 or 212 are false, control returns to step 152.

The power ratio SOC estimation approach monitors power pulse pairs. The method calculates the ratio of power capabilities in charge and discharge when the swings of the pulse pairs are approximately equal. The SOC is a function of the power ratio and is determined by a lookup table. The algorithm was derived while attempting to use inputs of current and voltage to solve for relaxation voltage $V_0$.

The voltage equation as the maximum or minimum power is held to a voltage limit is $V_{lim} = V_0 + V_P + I_{lim}R_0$. Substitution of the calculation for $V_0 + V_P$ from a prior sampling interval into the equation for $V_{lim}$ yields $V_{lim} = (V - IR_o) + I_{lim}R_o$. In this case, we are assuming that $V_0 + V_P$ for the current sampling interval is approximately equal to $V_0 + V_P$ of the prior sampling interval (in other words, $V_0 + V_P \cong V_{t=i-1} - I_{t=i-1} R_0$). This approximation is valid if the sampling interval is sufficiently small since the battery and ambient conditions are very similar. For example in some implementations, a sampling interval 10 ms<T<500 ms may be used, although other sampling intervals may be used. In one embodiment, T=100 ms. Sampling intervals of 1 second have been used successfully. If the sampling interval is determined to be excessive in duration then $R_o$ would be increased as a constant or as a temperature dependent variable.

Solving for $I_{lim}$ yields the following:

$$I_{\lim} = \frac{V_{\lim} - V_{t=i-1} + I_{t=i-1}R_0}{R_0}.$$

Therefore, since $P_{lim} = V_{lim}I_{lim}$, $$P_{\lim} = V_{\lim}\left(\frac{V_{\lim} - V_{t=i-1} + I_{t=i-1}R_0}{R_0}\right).$$

At the time that power limit is established for a charge or discharge swing and measured current, the measured current and voltage values are stored. When the current is reversed, the swing amplitude passes the negative of the retained swing, and the current is approximately equal to the negative of the retained current, a power limit calculation is performed.

The power ratio is calculated by taking $P_{lim}$ in charge divided by $-P_{lim}$ in discharge for adjacent cycles. Even though $V_0$ and $V_p$ are no longer in the equation, their contributions are reflected in current and voltage measurements, which are functions of both the polarization build up and $V_0$. The polarization voltage $V_p$ during a charge swing is approximately equal to the polarization voltage $V_p$ during a discharge swing of approximately equal negative. Using this approximation, the power ratio SOC estimation is used to remove $V_p$ from the calculation. The use of the power limit ratio has the effect of adding consideration of the low discharge power at low SOC and the low charge acceptance at high SOC to the stated charge determination.

Figure 6:
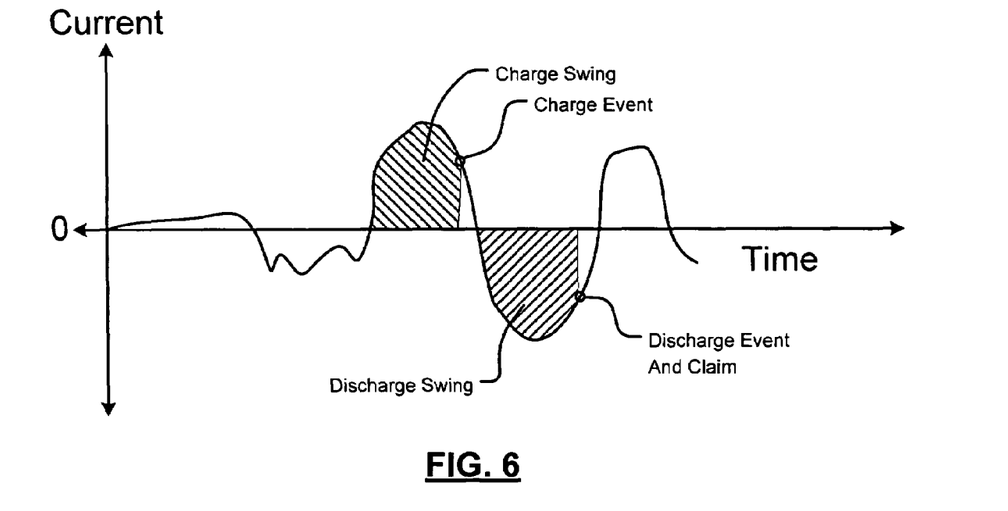
FIG. 6 is a graph of battery current as a function of time with charge and discharge swing and charge and discharge events shown.

In FIG. 6, the battery current is shown. The present invention monitors charge and discharge swing and declares charge and discharge events under certain circumstances. A charge swing event occurs when the charge swing is greater than a charge swing threshold. A discharge event occurs when a discharge swing is greater than a discharge swing threshold. The thresholds may be related to or based on a prior charge or discharge event. For example, a charge swing threshold may be set equal to the absolute value of a prior discharge event. A discharge swing threshold may be set equal to the absolute value of a prior charge event. Still other approaches may be used to determine the charge and discharge thresholds. As used herein, the term claim refers to situations when a charge or discharge event is followed by a discharge or charge claim and when other conditions described below are met. The occurrence of discharge event is determined independently from the occurrence of the discharge claim, to different criteria. The algorithm looks for both simultaneously. For example, the claim point occurs at the time that the area discharge swing is equal to the previous charge swing. The event point occurs when the ratio current vs. discharge current MIN is roughly equal to the ratio current at charge event vs. charge current MAX. This would be the case if L =K in FIG. 7. In some implementations, L and K are between 1 and 2, although other values may be used.

Figure 7:
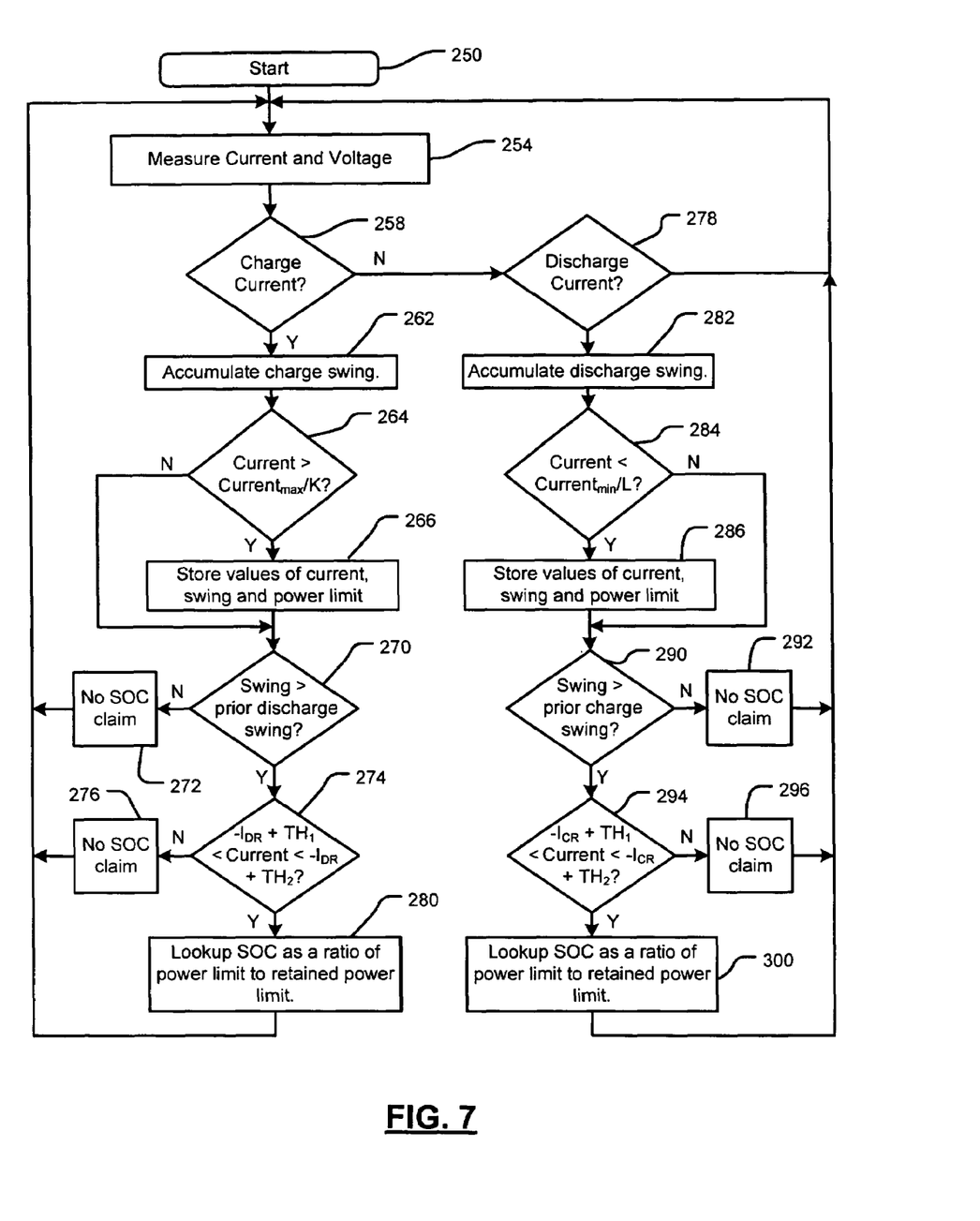
FIG. 7 is a flowchart illustrating a power ratio approach of estimating battery state of charge.

Referring now to FIG. 7, the power ratio SOC estimation method according to the present invention is shown in further detail. Control begins with step 250. In step 254, control measures current and voltage. In step 258, control determines whether there is a charge current. Charge current is defined by positive current above zero or a predetermined positive threshold. If step 258 is true, control continues with step 262 and accumulates charge swing. In step 264, control determines whether the current during the charge swing passes a maximum value and is greater than Current$_{max}$/K. When step 264 is true, control stores values of current, charge swing and power limit in step 266. If not, control continues past step 266 to step 270. In step 270, control determines whether the swing is greater than the prior discharge swing. If not, control does not make an SOC claim in step 272 and control continues with step 254.

If step 270 is true, control determines whether the current is approximately equal to a retained discharge current $-I_{DR}$ (in other words within upper and lower thresholds thereof) in step 274. If step 274 is false, control does not make an SOC claim in step 276 and control continues with step 254. If step 274 is true, control looks up SOC as a ratio of power limit to retained power limit in step 280.

If step 258 is false, control continues with step 278 and determines whether discharge current is present. Discharge current is present when discharge current is less than zero or a predetermined negative threshold. If step 278 is false, control returns to step 254. If step 278 is true, control continues with step 282 and accumulates discharge swing. In step 284, control determines whether the current during the discharge swing passes a minimum value and is less than Current$_{min}$/L. When step 284 is true, control stores values of current, the discharge swing and power limit in step 286. If not, control continues past step 286 to step 290. In step 290, control determines whether the discharge swing is greater than the prior charge swing. If not, control does not make an SOC claim in step 292 and control continues with step 254.

If step 290 is true, control determines whether the current is approximately equal to a retained charge current $-I_{CR}$ (in other words within upper and lower thresholds thereof) in step 294. If step 294 is false, control does not make an SOC claim in step 296 and control continues with step 294. If step 294 is true, control looks up SOC as a ratio of power limit to retained power limit in step 300.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A battery control module for a battery system, comprising:
   a voltage measuring module that measures battery voltage;
   a current measuring module that measures battery current; and
   a state of charge (SOC) module that communicates with said current and voltage measuring modules and that selectively enables SOC estimation when an accumulated charge swing during charge is greater than or equal to a negative of an accumulated discharge swing during a prior discharge and a charge current is within a predetermined window of a negative of a retained discharge current during said prior discharge.

2. The battery control module of claim 1 wherein said SOC module estimates SOC when an accumulated discharge swing during discharge is greater than or equal to a negative of an accumulated charge swing during a prior charge and a discharge current is within a predetermined window of a negative of a retained charge current during said prior charge.

3. The battery control module of claim 1 wherein said SOC module calculates a power limit during charging, calculates a power limit ratio based on said power limit during charging and a retained power limit during said prior discharge, and estimates SOC based on a power limit ratio.

4. The battery control module of claim 2 wherein said SOC module calculates a power limit during discharging, calculates a power limit ratio based on said power limit during discharging and a retained power limit during said prior charge, and estimates SOC based on a power limit ratio.

5. The battery control module of claim 1 wherein said SOC module accumulates said charge swing during charging until a maximum charge current divided by K is reached and stores said charge current and said charge swing as said accumulated charge swing.

6. The battery control module of claim 2 wherein said SOC module accumulates said discharge swing during discharging until a minimum discharge current divided by L is reached and stores said minimum discharge current as said discharge current and said discharge swing as said accumulated discharge swing.

7. The battery module of claim 3 wherein said SOC module includes a lookup table and wherein said SOC module looks up said SOC as a function of said power limit ratio.

8. The battery module of claim 4 wherein said SOC module includes a lookup table and wherein said SOC module looks up said SOC as a function of said power limit ratio.

9. A battery control module for a battery system, comprising:
   a voltage measuring module that measures battery voltage;
   a current measuring module that measures battery current; and
   a state of charge (SOC) module that communicates with said current and voltage measuring modules and that selectively enables SOC estimation when an accumulated discharge swing during discharge is greater than or equal to a negative of an accumulated charge swing during a prior charge and a discharge current is within a predetermined window of a negative of a retained charge current during said prior charge.

10. The battery control module of claim 9 wherein said SOC module estimates SOC when an accumulated charge swing during charge is greater than or equal to a negative of an accumulated discharge swing during a prior discharge and a charge current is within a predetermined window of a negative of a retained discharge current during said prior discharge.

11. The battery control module of claim 10 wherein said SOC module calculates a power limit during charging, calculates a power limit ratio based on said power limit during charging and a retained power limit during said prior discharge, and estimates SOC based on a power limit ratio.

12. The battery control module of claim 9 wherein said SOC module calculates a power limit during discharging, calculates a power limit ratio based on said power limit during discharging and a retained power limit during said prior charge, and estimates SOC based on a power limit ratio.

13. The battery control module of claim 10 wherein said SOC module accumulates said charge swing during charging until a maximum charge current divided by K is reached and stores said maximum charge current as said charge current and said charge swing as said accumulated charge swing.

14. The battery control module of claim 9 wherein said SOC module accumulates said discharge swing during discharging until a minimum discharge current divided by L is reached and stores said minimum discharge current as said discharge current and said discharge swing as said accumulated discharge swing.

15. The battery module of claim 11 wherein said SOC module includes a lookup table and wherein said SOC module looks up said SOC as a function of said power limit ratio.

16. The battery module of claim 12 wherein said SOC module includes a lookup table and wherein said SOC module looks up said SOC as a function of said power limit ratio.

17. A method for operating a battery control module for a battery system, comprising:
- measuring battery voltage;
- measuring battery current; and
- selectively enabling state of charge (SOC) estimation when an accumulated charge swing during charge is greater than or equal to a negative of an accumulated discharge swing during a prior discharge and a charge current is within a predetermined window of a negative of a retained discharge current during said prior discharge.

18. The method of claim 17 further comprising estimating said SOC when an accumulated discharge swing during discharge is greater than or equal to a negative of an accumulated charge swing during a prior charge and a discharge current is within a predetermined window of a negative of a retained charge current during said prior charge.

19. The method of claim 17 further comprising:
- calculating a power limit during charging;
- calculating a power limit ratio based on said power limit during charging and a retained power limit during said prior discharge; and
- estimating SOC based on a power limit ratio.

20. The method of claim 18 further comprising:
- calculating a power limit during discharging;
- calculating a power limit ratio based on said power limit during discharging and a retained power limit during said prior charge; and
- estimating SOC based on a power limit ratio.

21. The method of claim 17 further comprising:
- accumulating said charge swing during charging until a maximum charge current divided by K is reached; and
- storing said charge current and said charge swing as said accumulated charge swing.

22. The method of claim 18 further comprising:
- accumulating said discharge swing during discharging until a minimum discharge current divided by L is reached; and
- storing said discharge current and said discharge swing as said accumulated discharge swing.

23. The method of claim 19 wherein said SOC module includes a lookup table and wherein said SOC module looks up said SOC as a function of said power limit ratio.

24. The method of claim 20 wherein said SOC module includes a lookup table and wherein said SOC module looks up said SOC as a function of said power limit ratio.

25. A method for operating a battery control module for a battery system, comprising:
- measuring battery voltage;
- measuring battery current; and
- estimating state of charge (SOC) only when an accumulated discharge swing during discharge is greater than or equal to a negative of an accumulated charge swing during a prior charge and a discharge current is within a predetermined window of a negative of a retained charge current during said prior charge.

26. The method of claim 25 further comprising estimating said SOC when an accumulated charge swing during charge is greater than or equal to a negative of an accumulated discharge swing during a prior discharge and a charge current is within a predetermined window of a negative of a retained discharge current during said prior discharge.

27. The method of claim 26 further comprising:
- calculating a power limit during charging;
- calculating a power limit ratio based on said power limit during charging and a retained power limit during said prior discharge; and
- estimating SOC based on a power limit ratio.

28. The method of claim 25 further comprising:
- calculating a power limit during discharging;
- calculating a power limit ratio based on said power limit during discharging and a retained power limit during said prior charge; and
- estimating SOC based on a power limit ratio.

29. The method of claim 26 further comprising:
- accumulating said charge swing during charging until a maximum charge current divided by K is reached; and
- storing said charge current and said charge swing as said accumulated charge swing.

30. The method of claim 25 further comprising:
- accumulating said discharge swing during discharging until a minimum discharge current divided by L is reached; and
- storing said discharge current and said discharge swing as said accumulated discharge swing.

31. The method of claim 27 wherein said SOC module includes a lookup table and wherein said SOC module looks up said SOC as a function of said power limit ratio.

32. The method of claim 28 wherein said SOC module includes a lookup table and wherein said SOC module looks up said SOC as a function of said power limit ratio.

* * * * *